United States Patent
Takata et al.

(10) Patent No.: US 7,355,238 B2
(45) Date of Patent: Apr. 8, 2008

(54) NONVOLATILE SEMICONDUCTOR MEMORY DEVICE HAVING NANOPARTICLES FOR CHARGE RETENTION

(75) Inventors: Masaaki Takata, Miyagi (JP); Mitsumasa Koyanagi, Miyagi (JP)

(73) Assignees: Asahi Glass Company, Limited, Tokyo (JP); Tohoku University, Sendai-shi (JP)

(*) Notice: Subject to any disclaimer, the term of this patent is extended or adjusted under 35 U.S.C. 154(b) by 0 days.

(21) Appl. No.: 11/003,421

(22) Filed: Dec. 6, 2004

(65) Prior Publication Data
US 2006/0118853 A1 Jun. 8, 2006

(51) Int. Cl.
*H01L 29/76* (2006.01)
(52) U.S. Cl. ............... 257/314; 977/943; 365/185.01
(58) Field of Classification Search ............. 257/314, 257/316, 239, 261, 324–325; 365/185.01; 977/943; 438/197, 257, 264, 593
See application file for complete search history.

(56) References Cited

U.S. PATENT DOCUMENTS

| | | | | |
|---|---|---|---|---|
| 5,714,766 | A * | 2/1998 | Chen et al. .................. 257/17 |
| 5,801,401 | A * | 9/1998 | Forbes ........................ 257/77 |
| 5,852,306 | A * | 12/1998 | Forbes ....................... 257/315 |
| 6,413,819 | B1 * | 7/2002 | Zafar et al. ................. 438/257 |
| 6,746,893 | B1 * | 6/2004 | Forbes et al. ............... 438/105 |
| 6,927,136 | B2 * | 8/2005 | Lung et al. .................. 438/288 |
| 6,936,884 | B2 * | 8/2005 | Chae et al. .................. 257/315 |
| 7,005,697 | B2 * | 2/2006 | Batra et al. .................. 257/315 |
| 2003/0151948 | A1 * | 8/2003 | Bhattacharyya ......... 365/185.18 |
| 2005/0072989 | A1 * | 4/2005 | Bawendi et al. ............ 257/200 |
| 2005/0122775 | A1 * | 6/2005 | Koyanagi et al. ....... 365/185.11 |

FOREIGN PATENT DOCUMENTS

| | | |
|---|---|---|
| JP | 11-186421 | 7/1999 |
| JP | 2003-51498 | 2/2003 |

\* cited by examiner

*Primary Examiner*—Jerome Jackson
*Assistant Examiner*—Jami M Valentine
(74) *Attorney, Agent, or Firm*—Oblon, Spivak, McClelland, Maier & Neustadt, P.C.

(57) ABSTRACT

A nonvolatile semiconductor memory device including a source region and a drain region formed on a surface of a semiconductor substrate, a channel-forming region formed so as to connect the source region and the drain region or so as to be sandwiched between the source region and the drain region, a tunnel insulating film formed in contact with the channel-forming region, a charge retention layer formed adjacently to the tunnel insulating film, a gate insulating film formed adjacently to the charge retention layer, and a control gate formed adjacently to the gate insulating film. The charge retention layer includes an insulating matrix having, per nonvolatile semiconductor memory device, one conductive nano-particle which is made of at least one single-element substance or chemical compound that functions as a floating gate.

12 Claims, 4 Drawing Sheets

1: p-type semiconductor substrate
2: tunnel insulating film
3a1: Si nano-particles
4: gate insulating film
5: control gate
9: electron
10a: bottom level of conduction band of Si nano-particles
10b: bottom level of conduction band of tunnel insulating film
12: potential barrier 1: p-type semiconductor substrate
2: tunnel insulating film
3a2: metal nano-particles
4: gate insulating film
5: control gate
9: electron
10b: bottom level of conduction band of tunnel insulating film
11a: Fermi level of metal nano-particles
12: potential barrier

NONVOLATILE SEMICONDUCTOR MEMORY DEVICE HAVING NANOPARTICLES FOR CHARGE RETENTION

BACKGROUND OF THE INVENTION

1. Field of the Invention

The present invention relates to a nonvolatile semiconductor memory device and its manufacturing process. In particular, the present invention relates to a structure in which particles with nano-scale consisting of at least one type of single-element substance or its compound are densely distributed in an insulating matrix. Further, the present invention relates to a nonvolatile semiconductor memory device having a charge retention layer with excellent retention characteristic by optimizing the work function or the electron affinity between the nano-particles and the insulating matrix, and by optimizing the distances between surfaces of adjacent nano-particles, and its manufacturing process realizing low cost and good reproducibility.

2. Discussion of Background

Heretofore, as a recording medium in which a large amount of data can be memorized and rewritten, a memory device employing a semiconductor such as DRAM or SRAM, or a rotating-disk type recording medium such as a hard disk, an optical magnetic disk or an optical disk, have been present, and systems employing these media have been developed and used. Among these, DRAMs having such characteristics that data-reading and writing speed is high or that high-density integration can be easily achieved, are widely employed as main memory devices for e.g. personal computers. However, since DRAMs have volatility of data (a record retained in a DRAM disappears when electric power supplied from the outside is stopped), which is fatal to a memory device, electric power supplied from the outside is essential to maintain the record and power consumption thereby increases. This characteristic of data volatility is extremely inconvenient particularly when a mobile information device relying on e.g. a battery for power source is used.

On the other hand, a recording medium such as a hard disk system does not have volatility of data. However, it has disadvantages such that the writing and reading speeds are slow and the power consumption is relatively large. Further, from its device structure, there is a disadvantage that it is weak to mechanical vibration and impact. These disadvantages make the hard disk system extremely inconvenient to be used for mobile information devices.

Recent expansion of mobile information devices market for ubiquitous society demands that memory media obtain characteristics of non-volatility, high memory density, high speed performance, realizing good handling capability such as stable operation even under mechanical vibration or impact at a time of mobile use, requiring low power consumption and availability at low cost.

AS a medium satisfying the above-mentioned characteristic requirements, a nonvolatile semiconductor memory device such as a flash memory, a FeRAM (Ferroelectric Random Access Memory), an MRAM (Magnetic Random Access Memory) or a PRAM (Phase-change Random Access Memory) has been expected, and these are currently under development or partially in a stage of practical use.

Each of these nonvolatile memories has advantages and disadvantages. For example, an MRAM has many advantages such as high speed writing and excellent endurance characteristic, whereby it is regarded as the most major candidate for the memory leading the next huge memory market. However, an MRAM is mentioned to have problems such that miniaturization of the cell size is difficult, one of the reasons is that scaling down of MTJ (Magnet Tunnel Junction) element in the MRAM cell causes increase in current for reverse of magnetization of free layer in the MTJ due to increase in coercivity of the ferromagnetic material as the free layer. Besides, the MRAM has some disadvantages in terms of manufacturing cost, and a ferromagnetic material having many process-related technical problems needs to be introduced.

On the other hand, a flash memory has advantages such that since its memory cell is basically constituted by a single transistor only, its construction is simple and the cell size can be made smaller, whereby a highly integrated memory can be manufactured with relatively low cost by employing conventional DRAM process techniques. From these reasons, flash memories have already formed a large market as memories for mobile information devices. In recent years, realization of high speed operation and high density integration of semiconductor device have been in progress. Along this trend, researches to achieve high performance such as miniaturization of memory cells, high speed operation and improvement of charge retention characteristic are popularly pursued in the field of flash memory.

In a flash memory currently already widely circulated in the market, for an example of NOR type flash memory, read-out operation of data reserved in an assigned memory cell is performed at high speed within a relatively short time of about 100 ns (nano seconds) or shorter.

On the other hand, data-writing is performed by injecting channel-hot electrons (CHE) from a channel to a floating gate, and data-erasing is performed by discharging charge by Fowler-Nordheim (FN) tunnel current from the floating gate to a substrate or to a source region. In the case of CHE injecting, although moving speed of charge is high, charge-injection efficiency (proportion of CHE injecting current to CHE generating current) is low, and in the case of discharging charge by FN tunnel current, moving speed of charge is low. Therefore, re-writing operation takes long time in both of these methods.

Specifically, it takes a relatively long time such as a rank of 1 μs (micro seconds) for writing and from several hundreds of milliseconds to several seconds for erasing. Therefore, although achieving large volume or low cost is relatively easy in the case of flash memory, its application is limited and the replacement of high speed memories such as DRAMs by flash memories is currently difficult.

In order to reduce the re-writing time to overcome this disadvantage, a method of reducing the physical thickness of a tunnel insulating film preventing the reduction of re-writing time, is considered for example. However, if the thickness of the oxide film is reduced, since extremely strong electric field inversely proportional to the film thickness is applied to the tunnel insulating film when the floating gate is charged, repeated passing of charge through the oxide film by repeated re-writing operation causes a stress, and the oxide film becomes likely to have dielectric breakdown (stress-induced leak current).

When the insulation breakdown occurs at least one point in the tunnel insulating film, most of charge retained in the floating gate leaks and the memory cell loses the data retention capability. Therefore, at present, in order to maintain the reliability of charge-retention, it is necessary to make the tunnel insulating film thick, and it is difficult to reduce the re-writing time. Further, since there is a scaling rule that the thickness of the oxide film and the entire dimension of the cell similarly shrink, the problem of oxide thickness prevents miniaturization of entire device.

Further, it is pointed out that as a result of high dense integration of memory devices, the distance between floating gates of adjacent cells becomes smaller, and mis-readings and mis-writings tends to occur due to strong capacitive coupling formed between them. This influence of the capacitive coupling is particularly remarkable in NAND type flash memories.

From these reasons, the difficulty of miniaturization and high integration of the present bulk-floating gate type flash memory devices will rapidly increase from now on, and it is said that the limit of miniaturization will arise as early as around the year of 2007.

As means to prevent the lowering of charge-retention ability due to insulation breakdown while maintaining the ability of high-speed operation, and reducing the influence of the capacitive coupling between floating gates of adjacent cells, there is a method of retaining charge as it is spatially discreted. As nonvolatile semiconductor memories employing this method, a MONOS (Metal-Oxide-Nitride-Oxide-Semiconductor) memory and a SONOS (the material of gate electrode is a semiconductor instead of metal in MONOS memory. e.g. polysilicon is employed as the electrode material) are mentioned.

As shown in FIG. 4, they are memories having a structure that a tunnel insulating film 2 and a $SiN_x$ film as a charge retention layer 3 instead of a floating gate, are stacked, and charge are trapped in the interface states 3a-1 present in the interface and in the trap levels 3a-2 discretely distributed in the $SiN_x$ film. Here, in FIG. 4, reference numeral 1 indicates a p-type semiconductor substrate, 4 indicates a gate insulating film, 5 indicates a control gate electrode, 6 indicates a source region and 7 indicates a drain region.

Since the interface state 3a-1 and the trap level 3a-2 retaining charge are spatially discretely distributed, even if a dielectric breakdown occurs at one point in the tunnel insulating film 2, only a local leakage of charge occurs and the charge-retention ability of the memory cell does not drastically change between before and after the occurrence of the dielectric breakdown.

From these reasons, a MONOS memory is superior to a present bulk-floating gate type flash memory in the endurance characteristic, and a MONOS memory is advantageous in terms of miniaturization of memory cells since the physical thickness of the tunnel insulating film can be relatively thinner. However, from reasons such that the depth of the trap level of $SiN_x$ film (energy difference between the trap level and the bottom of conduction band for an electron, and energy difference between the trap level and the top of valance band for a hole) is not always sufficient, there is a disadvantage that charge once trapped tends to escape, and absolute charge-retention ability (the charge-retention ability of a cell in a normal state with no dielectric breakdown occurred) is low.

On the other hand, as a method for dealing with the dielectric breakdown of the oxide film and the capacitive coupling problem between adjacent floating gates by retaining charges in a discrete manner as in MONOS memories and for further enhancing the absolute charge retention ability than MONOS memories, a structure wherein the floating gates comprise Si nano-particles and the large number of nano-particles are dispersed in the gate insulating film, has been considered. FIG. 5 shows an example of semiconductor memory device having Si nano-particles. Here, in FIG. 5, the name of each of the constituents in the device are the same as that indicated by corresponding numeric symbols of FIG. 4 except for Si nano-particles 3.

The memory having this structure is described, for example, in JP-A-11-186421. The publication describes a structure wherein a large number of Si nano-particles 3 formed by CVD method constitute a floating gate and their periphery is covered with a gate insulating film 4.

In a case where the floating gates are made of intrinsic (containing no impurities) Si nano-particles, an injected electrons are trapped in conduction band states of the Si nano-particles, and the height of potential barrier for the electron is the difference between the bottom level of conduction band of the oxide film surrounding the nano-particles and that of Si nano-particles, namely, the difference between the electron affinities of Si and the oxide film. Since the potential barrier is usually higher than a potential barrier for the traps in a $SiN_x$ film in MONOS memories, the trapped electron can hardly to escape to the semiconductor substrate or to the control gate electrode. Namely, the charge retention ability becomes higher than that of MONOS memories.

However, when the charge retaining ability is considered from the viewpoint of potential barrier, the material constituting the nano-particles is preferably a metal rather than Si. FIG. 1(A) is a schematic view showing energy levels in a state that Si nano-particles retain electrons. Here, reference numeral 1 indicates a p-type semiconductor substrate, 2 indicates a tunnel insulating film, 3a1 indicates Si nano-particles, 4 indicates a gate insulating film, 5 indicates a control gate, 9 indicates an electron, 10a and 10b indicate the bottom levels of conduction bands of Si nano-particles and tunnel insulating film respectively, and 12 indicates potential barrier. The injected electron 9 is trapped in the bottom level 10a of conduction band of Si nano-particles. The potential barrier 12 for the electron 9 in this case, is the difference between the bottom level 10b of conduction band of the tunnel insulating film and the bottom state 10a of conduction band of Si nano-particles at the interface between the Si nano-particles 3 and the tunnel insulating film 2, namely, the difference between the electron affinity of the oxide film and the electron affinity of the Si nano-particles. On the other hand, FIG. 1(B) is a schematic view showing an energy level in the case where the nano-particles are made of metal. 11a indicates the Fermi level of the metal nano-particles, and other reference numerals identical to those of FIG. 1(A) indicate the same constituents of FIG. 1(A). In this case, an electron is trapped in the Fermi level 11a of the metal nano-particles, and the height of potential barrier 12 in this case becomes the difference between the bottom level 10b of conduction band of the tunnel insulating film and the Fermi level 11a of the metal nano-particles at the interface between the metal nano-particles and the tunnel insulating film, namely, the difference between the work function of the metal and the electron affinity of the oxide film. Since the work function of many metals are the value larger than the electron affinity of Si, the potential barrier formed by the metal in the oxide film is higher than that in the case of Si. From this reason, it can be explained that metal nano-particles have higher ability of retaining charge than Si nano-particles.

SUMMARY OF THE INVENTION

The present invention is to solve the above-mentioned problem in existing flash memories, namely, bulk-floating gate type flash memories, MONOS memories, SONOS memory and Si nano-particle floating gates type flash memories, namely, the problem that the charge retention characteristic is low. This problem causes various problems in the characteristic of the above-mentioned nonvolatile memory devices, such that miniaturization or high integration of the devices is difficult and that the improvement of the speed of data-writing operation or data-erasing operation is difficult. Therefore, by improving the charge retention characteristic by the present invention, these problems can also be solved at the same time.

Namely, it is an object of the present invention to provide a floating gate type nonvolatile semiconductor memory device having high charge retention characteristic, and to provide a nonvolatile semiconductor memory device in which miniaturization and high integration of the device and increasing of the operation speed are possible, and further to provide a process for manufacturing such a nonvolatile semiconductor device with good repeatability.

Considering the above-mentioned points, the first aspect of the present invention provides a nonvolatile semiconductor memory device comprising a source region and a drain region formed on a surface of a semiconductor substrate; a channel-forming region formed so as to connect the source region and the drain region or so as to be sandwiched between the source region and the drain region; a tunnel insulating film formed in contact with the channel-forming region; a charge retention layer formed adjacently to the tunnel insulating film; a gate insulating film formed adjacently to the charge retention layer; and a control gate formed adjacently to the gate insulating film, characterized in that the charge retention layer consists of an insulating matrix containing, per nonvolatile semiconductor memory device, one conductive nano-particle which is made of at least one single-element substance or chemical compound that functions as a floating gate and has a particle size of at most 5 nm, or containing a plurality of conductive nano-particles of the same type independently dispersed with a density of from $10^{+12}$ to $10^{+14}$ particles per square centimeter in the charge retention layer; the insulating matrix is amorphous and has an electron affinity of at most 1.0 eV; and the work function of the conductive nano-particles is at least 4.2 eV.

This construction enables to optimize the dispersion density, the particle size and the like of the nano-particles and to improve the yield of the device, and further, to optimize the height of energy barrier for electrons captured in the nano-particles by selecting the material constituting the nano-particles and the insulating matrix, which enables to further improve the charge retention ability than conventional devices. Or else, by the optimization of the energy barrier, it is possible to reduce the physical thicknesses of the tunnel insulating film and the gate insulating film with the charge retention characteristic maintained to be the same level as that of the conventional device, whereby it is possible to obtain a nonvolatile semiconductor memory device in which high speed of data writing and erasing operations and miniaturization and high integration of the device are realized.

Further, the second aspect of the present invention provides the nonvolatile semiconductor memory device according to the first aspect of the present invention, wherein the difference between the work function of the nano-particles and the work function of the semiconductor substrate is at most 0.5 eV.

Further, the third aspect of the present invention provides the nonvolatile semiconductor memory device according to the first aspect of the present invention, wherein the difference between the work function of the nano-particles and the work function of the control gate is at most 0.5 eV.

Further, the fourth aspect of the present invention provides the nonvolatile semiconductor memory device according to the first aspect of the present invention, wherein the distance between surfaces of the nano-particles adjacent to each other is from 1 to 5 nm.

Further, the fifth aspect of the present invention provides the nonvolatile semiconductor memory device according to the first aspect of the present invention, wherein the insulating matrix constituting the charge retention layer is made of at least one chemical compound selected from the group consisting of an oxide, a carbide, a nitride, a boride, a silicide, and a fluoride.

Further, the sixth aspect of the present invention provides the nonvolatile semiconductor memory device according to the first aspect of the present invention, wherein the nano-particles constituting the charge retention layer are dispersed two-dimensionally or three-dimensionally in the insulating matrix.

Further, the seventh aspect of the present invention provides a process for manufacturing the nonvolatile semiconductor memory device that has the charge retention layer wherein the nano-particles are dispersed two-dimensionally or three-dimensionally in the insulating matrix as defined in the sixth aspect of the present invention, characterized by forming the charge retention layer in a self-organizing manner by physical vapor deposition of each material to constitute the nano-particles and the insulating matrix.

Further, the eighth aspect of the present invention provides the process for manufacturing the nonvolatile semiconductor memory device according to the seventh aspect of the present invention, wherein the physical vapor deposition is performed by a sputtering method.

Further, the ninth aspect of the present invention provides a nonvolatile semiconductor memory device comprising a source region and a drain region formed on a surface of a semiconductor substrate; a channel-forming region formed so as to connect the source region and the drain region or so as to be sandwiched between the source region and the drain region; a tunnel insulating film formed in contact with the channel-forming region; an charge retention layer formed adjacently to the tunnel insulating film; a gate insulating film formed adjacently to the charge retention layer; and a control gate formed adjacently to the gate insulating film, characterized in that the charge retention layer consists of an insulating matrix containing, per nonvolatile semiconductor memory device, one semiconductive or insulating nano-particle which is made of at least one single-element substance or chemical compound that functions as a floating gate and has a particle size of at most 5 nm, or containing a plurality of semiconductive or insulating nano-particles of the same type independently dispersed with a density of from $10^{+12}$ to $10^{+14}$ particles per square centimeter in the charge retention layer; the insulating matrix is amorphous and has an electron affinity of at most 1.0 eV; and the electron affinity of the nano-particles is at least 4.2 eV.

This construction enables to optimize the dispersion density, the particle size and the like of the nano-particles and to improve the yield of the device, and further, to optimize the height of energy barrier for electrons captured in the nano-particles by selecting the materials constituting the nano-particles and the insulating matrix, which enables to further improve the charge retention ability than conventional devices. Or else, by the optimization of the energy barrier, it is possible to reduce the physical thicknesses of the tunnel insulating film and the gate insulating film with the charge retention characteristic maintained to be the same level as that of the conventional device, whereby it is possible to obtain a nonvolatile semiconductor memory device in which high speed of data writing and erasing operations and miniaturization and high integration of the device can be realized. Further, it is possible to expand the selection range of the material of the nano-particles from conductive materials to the range including semiconductors and insulating materials.

Further, the tenth aspect of the present invention provides the nonvolatile semiconductor memory device according to the ninth aspect of the present invention, wherein the difference between the work function of the nano-particles and the work function of the semiconductor substrate is at most 0.5 eV.

This construction provides not only the effect obtainable by utilizing the second and the tenth aspects of the present invention, namely, improvement of yield of the device and the charge retention characteristic, but also an effect that spontaneous introduction of charge from the semiconductor substrate to the nano-particles before writing operation can be prevented by limiting the difference between the work functions of the nano-particles and the semiconductor substrate to be at most 0.5 eV, which enables to prevent lowering of effective energy barrier.

Further, eleventh aspect of the present invention provides the nonvolatile semiconductor memory device according to the ninth aspect of the present invention, wherein the difference between the work function of the nano-particles and the work function of the control gate is at most 0.5 eV.

This construction provides not only the effect obtainable by utilizing the third and the eleventh aspects of the present invention, namely, improvement of yield of the device and the charge retention characteristic, but also an effect that spontaneous introduction of charge from the semiconductor substrate to the nano-particles before writing operation can be prevented by limiting the difference between the work functions of the nano-particles and the semiconductor substrate to be at most 0.5 eV, which enables to prevent lowering of effective energy barrier.

Further, the twelfth aspect of the present invention provides the nonvolatile semiconductor memory device according to the ninth aspect of the present invention, wherein the distance between surfaces of the nano-particles adjacent to each other is from 1 to 5 nm.

This construction, in a case of utilizing the fourth and the twelfth aspects of the present invention, enables to increase the insulation characteristic between nano-particles and to prevent transmission of charge between adjacent nano-particles. Accordingly, besides the above-mentioned effect, namely, improvement of charge retention characteristic, increase of operation speed and increase of integration, this construction enables to obtain a nonvolatile semiconductor memory device realizing the improvement of reliability of data rewriting and multi-bits operation.

Further, the thirteenth aspect of the present invention provides the nonvolatile semiconductor memory device according to the ninth aspect of the present invention, wherein the insulating matrix constituting the charge retention layer is made of at least one chemical compound selected from the group consisting of an oxide, a carbide, a nitride, a boride, a silicide, and a fluoride.

This construction, in a case of utilizing the fifth and the thirteenth aspects of the present invention, enables to select the material of the insulating matrix from the group consisting of oxides, carbides, nitrides, borides, silicides and chlorides, which enables to realize a nonvolatile semiconductor memory device excellent in the points including high energy barrier, high insulating characteristic and sufficient heat resistance.

Further, the fourteenth aspect of the present invention provides a the nonvolatile semiconductor memory device according to the ninth aspect of the present invention, wherein the nano-particles constituting the charge retention layer are dispersed two-dimensionally or three-dimensionally in the insulating matrix.

This construction, in a case of utilizing the sixth and fourteenth aspects of the present invention, enables to prevent a short-channel effect in a MOSFET (Metal-Oxide-Semiconductor Field Effect Transistor) since the thickness of the charge retention layer becomes thin when the dispersion of the nano-particles is two-dimensional. On the other hand, when the dispersion is three-dimensional, multi-bits operation becomes possible by controlling the distance between the centroid of charge distribution in the charge retention layer and the semiconductor substrate, or containment of charge by quantization effect of the nano-particles becomes possible. A nonvolatile semiconductor memory device having the above-mentioned characteristics can be realized.

Further, the fifteenth aspect of the present invention provides a process for manufacturing the nonvolatile semiconductor memory device that has the charge retention layer wherein the nano-particles are dispersed two-dimensionally or three-dimensionally in the insulating matrix as defined in the fourteenth aspect, characterized by forming the charge retention layer in a self-organizing manner by physical vapor deposition of each material to constitute the nano-particles and the insulating matrix.

This construction, in a case of utilizing the seventh and fifteenth aspects of the present invention, enables to suitably form a charge retention layer of the nonvolatile semiconductor memory device having the above-mentioned characteristics, since the physical vapor deposition method has such characterized that it can realize a thermodynamic state that the insulating matrix and the nano-particles tend to have phase separation in a self-organization manner, which enables to realize a nonvolatile semiconductor memory device having the above-mentioned characteristics.

Further, the sixteenth aspect of the present invention provides the process for manufacturing the nonvolatile semiconductor memory device according to the fifteenth aspect, wherein the physical vapor deposition is performed by a sputtering method.

This construction, in a case of utilizing the eighth and sixteenth aspects of the present invention, enables to realize a nonvolatile semiconductor memory device in which the charge retention layer of the nonvolatile semiconductor memory device having the above-mentioned characteristics can be suitably formed, can be realized since the sputtering method, among physical vapor deposition methods, particularly has such characteristics that it provides excellent adhesiveness to a foundation layer, it can form a dense film in which atoms constituting the film are strongly bonded, it enables wide selection of film-forming materials, and it is excellent in productivity with low film-forming cost.

BRIEF DESCRIPTION OF THE DRAWINGS

FIG. 1 is a schematic view of energy levels explaining that the charge retention characteristic is improved in the nonvolatile semiconductor memory device of the present invention, wherein

FIG. 2 is a cross-sectional schematic view showing an example of the nonvolatile semiconductor memory device of the present invention. In FIG. 2, numeric reference 1 indicates a p-type semiconductor substrate, 2 indicates a tunnel insulating film, 3 indicates an charge retention layer in which nano-particles 3a functioning as a floating gate are contained and dispersed in an insulating matrix 3b. Reference numeral 4 indicates a gate insulating film and 5 indicates a control gate. Further, 6 indicates a source region and 7 indicates a drain region.

Figure 1A:
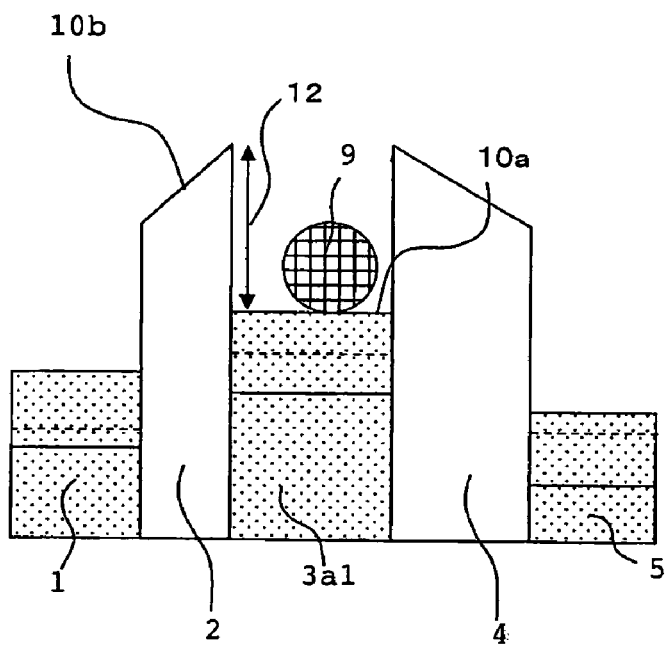
FIG. 1(A) shows a case where the nanoparticles are made of Si and (B) shows a case where the nano-particles are made of a metal.
Figure 1B:
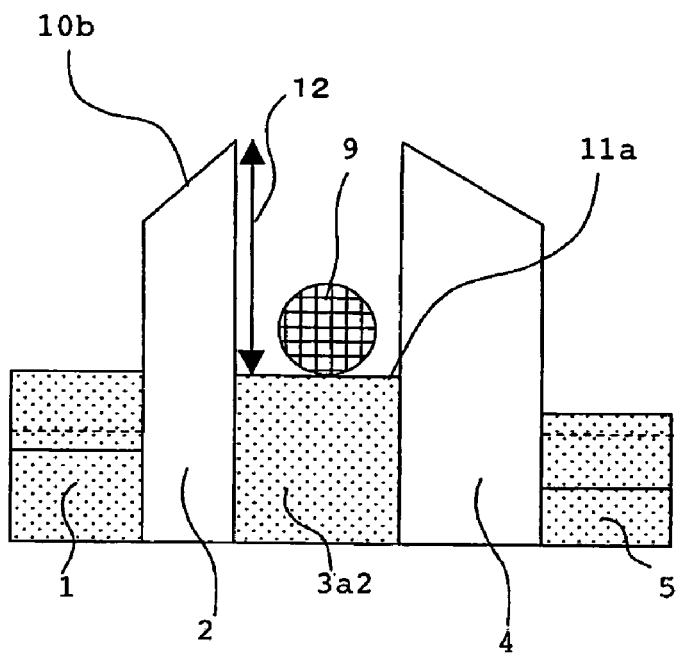

The p-type semiconductor substrate 1 may be one whose entire substrate is made of a semiconductor, or one in which a semiconductor layer is formed on an insulator, such as a SOI substrate. The tunnel insulating film 2 is preferably a silicon oxide film having relatively good boundary-matching with the silicon semiconductor substrate 1, or for the purpose of increasing the capacitive coupling between the surface of the semiconductor substrate and the control gate, a substance having high dielectric constant such as a $SiO_xN_y$ ($0 \leq x < 2$, $0 < y \leq 4/3$, moreover satisfying $2x+3y=4$ is more suitable) type material or a high-k material such as $HfO_2$.

Further, in a case where a heavy metal is employed for the floating gate material or for the control gate, it is preferred to prevent diffusion of the heavy metal element to the side of the semiconductor substrate through the tunnel insulating film and consequent change of the threshold voltage of MOSFET. From this reason, it is preferred to employ a nitride compound type insulating film such as $SiO_xN_y$ ($0 \leq x < 2$, $0 < y \leq 4/3$, moreover satisfying $2x+3y=4$ is more suitable) or a non-Si type oxide such as $HfO_2$ or $LaO_x$, for the purpose of preventing the diffusion of metal elements in the side of the semiconductor substrate.

Further, in order to perform data-writing/erasing operations at high speed, the thickness of the tunnel insulating film is preferably as thin as possible and it is preferably at most 8 nm. Further, it is extremely preferably at most 5 nm for the purpose of increasing the speed.

With respect to the nano-particles 3a constituting the charge retention layer 3, in order to minimize the loss of retained charge by dielectric breakdown of the tunnel insulating film 2, and in order to reduce the dispersion of threshold voltage shift between the presence and absence of charge accumulated in the nano-particles ($\Delta V_{th}$; it may also be referred to as memory window) among cells, it is preferred that a large number of nano-particles are dispersed at high density, specifically, it is preferred that the nano-particles are present at a density of from $10^{+12}$ to $10^{+14}/cm^2$. Further, at the same time, in order to increase the insulation characteristic of adjacent nano-particles, the distances between the surfaces of the nano-particles are preferably large, specifically, they are preferably at least 1 nm. However, since the high density dispersion can not be obtained if the distances are too large, the distances between the surfaces are preferably 5 nm. Further, in order to satisfy both high density dispersion of the nano-particles and the insulation characteristic of adjacent particles, the size of the nano-particles is preferably at most 5 nm, more preferably at most 3 nm.

Further, at the same time, their materials are preferably ones having durability against high temperature treatment in the semiconductor fabrication process, and for this reason, high-melting point material to be described later is preferably applied to the nano-particles 3a and insulating matrix 3b.

In order to improve the charge retention characteristic of the charge retention layer, it is effective to make the nano-particles dispersed in the charge retention layer, disposed in at least two stages, namely, it is effective to have a three-dimensional multi-layer structure. The multi-layer structure means, more specifically, a structure wherein the nano-particles arranged in a plane parallel to the surface of the semiconductor substrate form one layer, and such a plane arrangement is repeated with a thin insulating layer interposed between the plane arrangements. The reason why the charge retention characteristic is improved by such a multi-layer structure of nano-particles is explained as follows. Here, an arrangement structure in which two layers of nano-particles are laminated is assumed, and the nano-particle layers from the side of the semiconductor substrate are respectively assigned as the first layer and the second layer. In a state that charge is accumulated both in the first layer and the second layer, if an electron in the second layer tries to escape to the semiconductor substrate, the static potential formed by the electrons in the first layer existing on the way of the leakage route prevents the leakage of the electron in the second layer from leaking to the substrate, whereby the charge retention characteristic is further improved than that of the case of single layer arrangement.

The above-mentioned effect that a static potential formed by charged particles prevents the movement of charged particles existing in the vicinity and having the same charge sign, is called as the Coulomb blockade effect. This effect is represented by a formula $\Delta E_c = e^2/(2C)$. Here, $\Delta E_c$ indicates increasing amount of static potential, namely, the height of energy barrier formed by the Coulomb blockade, e indicates charge amount of an electron, and C indicates tunnel junction capacitance subjected to the charge transmission.

In order to realize the Coulomb blockade effect at a room temperature, it is necessary that the increase amount of the static potential $\Delta E_c$ is larger than the thermal energy $kT_r$ at the room temperature. Here, k indicates the Boltzmann constant and $T_r$ indicates a room temperature in Kelvin. Further, it is also necessary to satisfy the condition derived from the uncertainty principle, namely, the inter-junction resistance R needs to be about $R \approx h/e^2 \approx 26 k\Omega$ or more. Here, h indicates the Planck's constant.

In order to satisfy such necessary conditions and realize sufficient the Coulomb blockade effect, the tunnel junction capacitance is preferably small.

Further, extremely small size of nano-particles enables to be expected the following effect. Since the nano-particles have an extremely small particle size of at most 5 nm, it is probable that the distribution of the energy levels are quantized to be in a state of discretion. Now, two nano-particles present in the first layer and the second layer respectively and adjacent to each other in the vertical direction, are considered. The distribution state of energy levels of the two nano-particles in a state of no charge, are assumed to be equal. Here, when charge is injected only to the nano-particle present in the second layer, the energy levels of the charged nano-particle shift to high-energy side from the energy level of non-charged nano-particle present in the first layer. Accordingly, the height of energy level distributions of two nano-particles considered become relatively different, and there becomes no energy level present in the nano-particle in the first layer which is equal to the energy level of the nano-particle in the second layer. Therefore, there is no transmittable level in the nano-particle in the first layer, and the charge in the nano-particle in the second layer is prevented from leaking to the semiconductor substrate side via the nano-particle in the first layer. This phenomenon never occur in a bulk material in which the distribution of energy levels is continuous. This phenomenon occurs in a case where the particle size of the nano-particles is sufficiently small and the distribution of energy levels is quantized and discreted, whereby transmission of charge by tunnel phenomenon can be suppressed.

This is all about the physical reason why the charge retention characteristic is improved by the multi-layer structure of nano-particles in the charge retention layer. In order to effectively obtain the above-mentioned Coulomb blockade effect and the quantization effect, the particle size of each of the nano-particles is preferably as small as at most 5 nm, more preferably at most 3 nm. Further, in order to spatially unify the Coulomb blockade effect, the surface density of the nano-particles is preferably as high as $10^{+12}$ to $10^{+14}/cm^2$.

Further, in order to reduce the tunnel junction capacitance and increase the inter-junction resistance, the distances between surfaces of the nano-particles, namely, the distance between the first layer and the second layer in this case, should preferably be large to some certain extent, and preferably at least 1 nm. However, if the distance is too large, the distance between the semiconductor substrate and the control gate electrode becomes large and short-channel effect occurs in a case of a device having short channel length. Therefore, the distance between the surfaces is preferably about 5 nm at most.

In a case of CVD method conventionally commonly employed to obtain the dispersion structure of nano-particles, since the nano-particles and the insulating matrix are formed at different steps, the method for forming the dispersion state of nano-particles in a three-dimensional multi-layer structure, has been complicated. On the other hand, according to the forming method of the present invention, since the nano-particles and the insulating matrix are formed at the same time, and since the multi-layer structure in which nano-particles are distributed can be obtained self-organically, it can be formed extremely easily and with low cost. From these reasons, the forming method of charge retention layer of the present invention is extremely suitable for forming the above-mentioned multi-layer structure of nano-particles.

With respect to the gate insulating film 4, in order to achieve high-speed data-writing and erasing operations, or to increase the controllability of the distribution of electric field in the vicinity of the surface of the p-type semiconductor substrate 1 by the control gate voltage, it is preferred to perform the following steps. Namely, it is preferred to determine the film thickness and the material so as to increase the capacitive coupling of the control gate electrode 5 and the p-type semiconductor substrate 1 and the capacitive coupling of the control gate electrode 5 and the floating gate, namely, the nano-particles 3a. Further, it is preferred to make the physical thickness thin and to select a material having high dielectric constant. Specifically, the thickness is preferably at most 10 nm, and the material may preferably be, besides $SiO_2$, the above $SiO_xN_y$ type material or stacked films of $SiO_2$ and $SiO_xN_y$ ($0 \leq x < 2$, $0 < y \leq 4/3$, moreover satisfying $2x+3y=4$ is more suitable).

The charge retention layer is formed by employing a physical vapor deposition method. In general, besides the physical vapor deposition method, for example, a chemical vapor deposition method (chemical vapor phase deposition method, also named as CVD method) is also well known as a method for forming a thin film. However in the CVD method, a single phase film with no phase separation, namely, an equilibrium phase film is likely to be formed from such reasons that the vapor phase pressure at the time of film deposition is higher than that of physical vapor deposition method, and the frequency of collision between reactive atomic or molecular species in the vapor phase is high, and that the vapor phase temperature and the substrate surface temperature are also high. Therefore, the chemical vapor deposition method is not suitable for forming a film in which the nano-particles and the insulating matrix are separated as in the charge retention layer of the present invention, namely, for forming a film of a non-equilibrium phase or a quasi-equilibrium phase. Further, the types of source gases applicable for CVD method are not so many as compared with a physical vapor deposition method such as a sputtering method, and in particular, the types of source gases for forming metal film are not many. Further, the number of combinations of gas types suppliable to a reaction chamber at the same time, is further small, and the type of materials which can form a film is thereby limited, whereby chemical vapor deposition method is not suitable also from this reason.

The charge retention layer is formed by a single-step process employing a physical vapor deposition method. As such a physical vapor deposition method, a sputtering method, a thermal vapor deposition method, an electron beam vapor deposition method, a laser ablation method and a molecular beam epitaxy method may be mentioned. Among them, a sputtering method is particularly preferred for such reasons that it enables a wide selection of film-forming materials, it enables to easily obtain a dense film since the incident energy of the film-forming particles into the substrate is high, it enables to obtain a film having a good adhesiveness to a foundation layer, and it is excellent in mass-productivity.

Further, the sputtering method is preferred since it provides suitable film-forming conditions for self-organization of the present invention. For example, since the vapor-phase pressure is sufficiently low, and a suitable substrate temperature that is not low and not high can be obtained, film-forming specie-particles perform an appropriate migration on a substrate surface, whereby a self-organization can be obtained.

The self-organization of the present invention means that a group of atoms constituting the nano-particles and a group of atoms constituting the insulating matrix are each spontaneously and separately disposed by e.g., a thermodynamic interaction, and consequently, particles with nano-scale of a metal or a semiconductor are gathered and organized in the insulating matrix phase. This phenomenon depends on the combination or abundance ratio of the material constituting the nano-particles and the material constituting the insulating matrix, and film-deposition conditions such as film-deposition pressure or substrate temperature.

Further, as the sputtering apparatus, usually used parallel and plane electrode type magnetron sputtering with capacitively coupled plasma can be also used for formation of the charge retention layer. However, for reduction of damage to the substrate, one employing inductively coupled plasma (ICP) or microwave induced plasma (ECR plasma), or an facing-targets type apparatus is preferred, and among these film-forming apparatuses, an apparatus having a function of applying an appropriate bias voltage to the film-deposition substrate, is particularly preferred since it is possible to control the incident energy of the film-forming particles into the substrate.

In a case of forming a charge retention layer by the sputtering method, it is necessary to sputter a material to form the phase for the nano-particles to be dispersed and the material to form the phase for the insulating matrix at the same time. There is a method of preparing the material of each phase independently and sputtering these plurality of targets at the same time, or a method of mixing the materials of both phases in a single target and sputtering the target material. In the second method, a product formed by sintering a mixture of powders of both phase-materials, or a single-phase target of the material of one of the phases in which an appropriate number of chip flakes of the material of the other phase is embedded so that they appear from the surface of the target, may be employed.

Further, in a case where the target is disposed with its sputtering plane directing vertically upward in the film-deposition chamber in the film-deposition apparatus, a single-phase target of the material of one of the phases on which an appropriate number of chip flakes of the material of the other phase are placed, or a mixture of powders of phases spread in e.g. a petri dish, may also be employed as the target. Here, the powder target is not suitable from a viewpoint of manufacturing a semiconductor device since, e.g., there is a risk that the powder spread in the film-deposition environment and adversely affect other semiconductor manufacturing processes.

In a case of forming the charge retention layer 3, as the combination of the material to obtain the phase (hereinafter referred to as the nano-particle dispersion phase) consisting of nano-particles appeared as dispersion phase in the charge retention layer 3, with the material (hereinafter referred to as the matrix phase material) to obtain the insulating matrix 3b, such a combination of materials that the materials of nano-particle dispersion phase and the matrix phase material bring about a phase-separation at a time of film-deposition, will be selected.

As the material for the dispersion phase, although it can be selected from any one of a metal, a semiconductor or an insulator, a material having a large work function or a large electron affinity is preferred from the viewpoint of obtaining high charge retention characteristic. Specifically, as a metal material, a material having a work function of at least 4.2 eV, and as a semiconductor or an insulating material, a material having an electron affinity of at least 4.2 eV, are preferred.

Further, as the material for nano-particle dispersion phase, a material having a work function as close to that of the semiconductor substrate or of the control gate electrode as possible, is preferred from viewpoints of preventing charge from spontaneously flowing into nano-particles before writing operation due to a potential difference between the work function of the nano-particle and the work function of the substrate or the control gate, preventing a drop of the effective height of potential barrier and consequently obtaining high charge retention ability. Specifically, a material having an absolute value of the difference between the work functions of the material of the nano-particle dispersion phase and the material of semiconductor substrate of at most 0.5 eV or a material having an absolute value of the difference between the work functions of the material of the nano-particle dispersion phase and the material of the control gate of at most 0.5 eV, is preferred.

This is because of the following reason. When materials having different work functions are bonded and they reach a thermal equilibrium state, transmission of electrons from one material to the other material occurs so as to equalize the Fermi level of both materials. Consequently, when the work function of the nano-particles is too high, the function of transmitting electrons from the semiconductor substrate or the control gate to the nano-particles exerts strongly, and such a state that electrons are spontaneously injected into the nano-particles before the operation of injecting electrons into the nano-particles occurs. If injection of electrons is tried from this state for the purpose of data-writing, the second electron or subsequent electrons are injected to the nano-particles. Hereinafter, for the convenience of explanation, the above-mentioned electron injected spontaneously before the writing operation is referred to as "thermal equilibrium electron" and the electron injected afterwards by the writing operation is referred to as "injection electron".

Here, since the thermal equilibrium electron influences the injection electron with the above-mentioned Coulomb blockade, it becomes harder for the injection electron to be injected into a nano-particle by a static energy of $\Delta E_c = e^2/(2C)$. Further, since the injection electron has higher energy by the above-mentioned $\Delta E_c$, the height of the potential barrier for the injection electron decreases by the $\Delta E_c$. Since an electron handled purposely by writing and erasing operations and functioning as a carrier of memory information, is mainly this injection electron, the above phenomenon is equivalent to the lowering of effective potential barrier.

Further, since the size of the nano-particles is in the order of nano-meter, an energy level distribution of electron in a nano-particle is quantized to be discrete. Assuming that a lower energy level is occupied by a thermal equilibrium electron and an injection electron can be captured in an energy level higher by $\Delta E_Q$, an energy higher by $\Delta E_Q$ than the energy level of the thermal equilibrium electron, is required for an electron to be injected, and the height of potential barrier for the injection electron after captured becomes lower by $\Delta E_Q$ in the same manner as the above-mentioned case of Coulomb blockade.

Actually, since both the Coulomb blockade effect and the quantization effect are present simultaneously, the height of potential barrier for the injection electron lowers by the sum of these effects, namely, by roughly $\Delta E_c + \Delta E_Q$, when secondary interaction between these two effects is ignored. Since the lowering of effective barrier is occurred by the first electron injected in the nano-particles in advance, it is important to prevent the thermal equilibrium electron from being spontaneously injected, and for this purpose, it is preferred that the work function of the nano-particles is close to the work function of the semiconductor substrate or the control gate electrodes.

Further, in the manufacturing process of the nonvolatile semiconductor memory device of the present invention, if the charge retention layer is subjected to a high temperature treatment, in order to prevent agglomeration of nano-particles due to heating, it is preferred that the melting point of the nano-particles is high, and specifically, the melting point is preferably at least 1,400° C.

Further, when the elements constituting the nano-particles are diffused and reached the semiconductor substrate, some type of elements form impurity levels in the band gap of the semiconductor substrate. In a case where the substrate is made of indirect transition type semiconductor, these levels behave recombination center and reduces the lifetime of carriers, and finally affects ON current or threshold voltage of MOSFET. Since the closer their impurity levels to the gap center of the semiconductor substrate, the higher the probability of recombination becomes, elements forming impurity levels close to the gap center, namely elements forming deep impurity levels, are not preferred as elements constituting the nano-particles. On the other hand, since the probability of recombination quickly and exponentially decreases as an energy difference between the impurity level and the gap center is large, namely the impurity levels is shallow, even if the element forms an impurity level, its effect to MOSFET operation becomes small so far as the level is away from the gap center to a certain extent. Therefore, elements constituting the nano-particles are preferably elements forming shallow impurity levels at levels at least 0.1 eV away from the gap center of the semiconductor substrate.

The material of the nano-particles is preferably selected considering the above-mentioned viewpoints, namely, work function, melting point and impurity levels. In a case where the semiconductor substrate is made of Si, the metal nano-particles are preferably made of W, Mo, Ti, Pt, Pd, Ni, Ta, Cr or the like, or may also be made of Os, Re, Nb, Ru or Rh.

The nano-particles of an element semiconductor are preferably made of at least one type selected from the group consisting of Se and Te. Further, they may be made of at least one type of semiconductor selected from the group consisting of Se and Te, containing at least one type of element selected from the group consisting of P, As, Sb, B, Al, Ga, In and Cu as an impurity.

The nano-particles of a compound semiconductor or an insulator are preferably made of at least one type of compound selected from the group consisting of InAs, InGaAs, InGaNAs, InAlAs, InAsP, InGaAsP, InSb, InGaSb, InAlSb, InGaAsSb, SiC, $Cu_2O$, ZnO, CdO, BaO, PbO, NiO, $In_2O_3$, $Sb_2O_3$, $SnO_2$, $Ag_2O$, AgO, $RuO_2$, $V_3Ga$, $Nb_3Sn$, $Nb_3Al$, $Nb_3Ga$, $Nb_3Ge$, NbTi, $NbMo_6S_8$, ZnS, CdS, HgS, PbS, $Sb_2S_3$, $Bi_2S_3$, ZnSe, CdSe, HgSe, SnSe, PbSe, $In_2Se_3$, $Sb_2Se_3$, $BiSe_3$, ZnTe, CdTe, HgTe, SnTe, PbTe, $In_2Te_3$, $Bi_2Te_3$, BN, GaN, InT, TiN, BP, AlP, GaP, InP, $Zn_3P_2$, $Cd_3P_2$, $ZnP_2$, $CdP_2$, AlAs, GaAs, $Zn_3As_2$, $Cd_3As_2$, $ZnAs_2$, $CdAs_2$, AlSb, GaSb, ZnSb, CdSb and $Si_3N_4$.

The nano-particles of a compound semiconductor or an insulator may also be made of at least one type of compound selected from the group consisting of $In_2O_3$, $Sb_2O_3$, $SnO_2$, ZnO and GaAs, which contains at least one of elements selected from the group consisting of as Sn, Sb, Ga, Al and In, as an impurity.

As the material for insulating matrix, any one of semiconductors or insulators can be selected. However, for the purpose of improving charge retention characteristic, it is preferably a material having as small electron affinity as possible, specifically, a material having an electron affinity of at most 1.0 eV. Besides this requirement, for the purpose of obtaining stability against thermal treatments in the semiconductor process, it is more preferred to select a material having a high-melting point of, specifically, at least 1,400° C. Further, at the same time, it is preferably a material forming amorphous state. This is because when the electron trapped in a nano-particle leaks through the insulating matrix by a tunnel transmission, the insulating matrix of amorphous rather than crystalline, increases the probability that the tunnel electron is scattered by atoms constituting the insulating matrix. As a result, it is expected that the effective leakage amount due to the tunnel transmission of electrons is lowered. In order to make the insulating matrix amorphous, it is extremely preferred to employ a physical vapor evaporation method such as a sputtering method as a film-deposition method for the nano-particle dispersion film. This is because physical vapor deposition methods such as a sputtering method can form a film even at a relatively low temperature, and as a result, an amorphous state can be easily obtained.

The material of the insulating matrix in the charge retention layer may, for example, be at least one type of compound selected from the group consisting of an oxide such as silica, alumina, titania, mullite, cordierite, spinel, zeolite, forsterite or magnesia; a carbide such as boron carbide ($B_4C$); a nitride such as silicon nitride, boron nitride or aluminum nitride; and a fluoride such as magnesium fluoride or aluminum fluoride.

In the process forming the charge retention layer by the sputtering method, the average particle size and the density of the dispersed phase growing in the matrix phase are changed by controlling the target composition ratio and some film-deposition conditions. Specifically, it has been observed that the average particle size and the density were changed by the area fraction between the dispersed phase and the matrix phase on the target surface and gas pressure at a time of sputtering. For an example of result, in a case of forming a film having Co metal nano-particles dispersed in an $SiO_2$ layer by employing a Co—$SiO_2$ type target, the density was $1 \times 10^{+13}/cm^2$ and the distance between surfaces of the nano-particles was 0.9 nm when the composition ratio between Co and $SiO_2$ of the Co—$SiO_2$ type target was made to be 23:77, while the density became $7 \times 10^{+12}/cm^2$ and the distance between the surfaces became 1.8 nm when the volume ratio was made to be 10:90. In this manner, the density and the distance between surfaces of the nano-particles can be controlled by adjusting the composition ratio of the target. Further, when the film was deposited with a volume ratio between Co and $SiO_2$ of 50:50 under an Ar gas pressure of 0.5 Pa, the size of the Co particles became about 2 nm. Meanwhile the size of the Co particles of Co became about 5 nm when the film was formed under an Ar gas pressure of 8 Pa.

The charge retention layer of nonvolatile semiconductor memory device of the present invention, employing a thin film formed by preparing nano-particles having a particle size of at most 5 nm made of a material having a work function or an electron affinity of at least 4.2 eV, and dispersing the nano-particles with high density in an amorphous insulator having an electron affinity of at most 1.0 eV, can retain many charges as they are independently distributed, and has high ability of retaining electrons. By this high charge retention ability, it becomes possible to reduce the thickness of the tunnel insulating film and the gate insulating film interposed between the charge retention layer and the control gate electrode. This feature is extremely advantageous for increasing operation speeds of writing and erasing, for reducing the operation voltage and for miniaturization and high integration of the device.

Further, the charge retention layer of nonvolatile semiconductor memory device of the present invention employing a thin film formed by preparing nano-particles having a particle size of at most 5 nm made of a material having a work function which is at most 0.5 eV different from the work function of the semiconductor substrate or the control gate electrode, and dispersing the nano-particles with high density in an amorphous insulator having an electron affinity of at most 1.0 eV, can retain many charges as they are independently distributed, and has an extremely high ability of retaining electrons since it is possible to suppress the reduction of effective value of energy barrier. By this high charge retention ability, it becomes possible to reduce the thickness of the tunnel insulating film and the insulating film interposed between the electric retention layer and the control gate electrode. This feature is extremely advantageous for increasing operation speeds of writing and erasing, for reducing the operation voltage and for achieving miniaturization and high integration of the device.

Further, by dispersing the nano-particles in the charge retention layer so that the distance between the surfaces of adjacent nano-particles is at least 1 nm and at most 5 nm, it is possible to prevent retained charges from transmitting between adjacent nano-particles. This feature is extremely advantageous in terms of device characteristics, in particular, for improvement of endurance and for stably performing multi-bits operation.

Further, by employing the sputtering method for forming the charge retention layer, materials having various compositions can be selected for the dispersed phase or the matrix phase. Since it is possible to easily incorporate the sputtering method into a conventional semiconductor manufacturing process as a film deposition process, it is possible to provide a high performance nonvolatile semiconductor memory device with good producibility and without major modifications in the conventional process.

Now, Examples of the present invention will be described.

EXAMPLE 1

Figure 2:
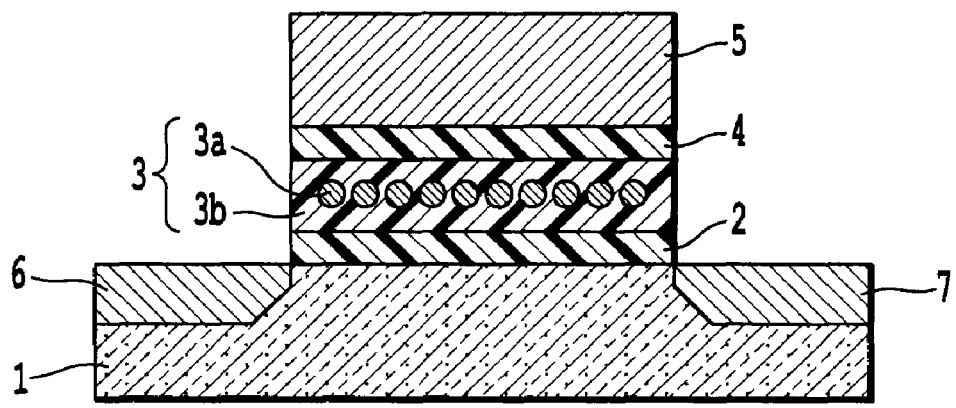
FIG. 2 is a cross-sectional schematic view showing Example 1 of the nonvolatile semiconductor memory device of the present invention.

The nonvolatile semiconductor memory device of this Example will be explained, referring to FIG. 2. A tunnel insulating film 2 was formed on a p-type semiconductor substrate 1. The tunnel insulating film 2 was formed on the surface of the semiconductor substrate 1 by subjecting the semiconductor substrate to thermal oxidation at 800° C. and had a thickness of 5 nm.

Then a charge retention layer 3 constituted by an insulating matrix 3b containing nano-particles 3a, was formed so as to have a thickness of 5 nm by a capacitively coupled magnetron sputtering method as described below. Metal Co having a work function of 5.0 eV was selected for the nano-particles and amorphous $SiO_2$ having an electron affinity of 1.0 eV for the insulating matrix. In the sputtering step, a target composed of a $SiO_2$ target having a diameter of 3 inches (7.62 cm) and Co chips of 5 mm square placed thereon, was employed. The amount of the Co chips was adjusted so that the chips occupy 20% of the vertically projected surface area of the target.

After evacuating a film deposition chamber of a sputtering apparatus to $5 \times 10^{-4}$ Pa, an Ar gas was introduced, and the gas flow rate was controlled so that the gas pressure in the film deposition chamber became 0.5 Pa. Plasma was generated by applying a RF (13.56 MHz) power of 200 W. The Co—$SiO_2$ composite film thus formed was observed by a TEM (Transmission Electron Microscope). As a result, it was observed that Co crystal nano-particles having an average particle size of about 2 nm were dispersed with an area density of about $8 \times 10^{12}/cm^2$ in amorphous $SiO_2$, and the distance between surfaces was estimated to be 1.6 nm.

After forming a $SiO_2$ film as a gate insulating film 4 on the Co—$SiO_2$ composite film, tungsten nitride ($W_2N$) and tungsten layer were laminated by the sputtering method to form a control gate 5. Then, an $SiO_2$ film to be employed for a hard mask for gate etching process was deposited. A positive photoresist was patterned to form a mask for gate etching and the $SiO_2$ film was etched to form a hard mask, followed by dry etching the tungsten and the tungsten nitride as the control gate electrode 5, the gate insulating film 4 and the charge retention layer 3. Then, a source region 6 and a drain region 7 were formed by an ion implantation of As and an annealing treatment. After a passivation film was deposited, a contact hole was formed and an Al electrode was formed so as to be in contact with the source region 6, the drain region 7 and the control gate electrode 5.

A memory cell having the Co—$SiO_2$ type charge retention layer, thus formed, has an extremely long charge retention time as compared with memory cells having Si nano-particles by the same method, and it was shown that the retention time calculated by extrapolating the measurement result exceeds 20 years. Further, it was confirmed that 2 bits of information can be memorized in each memory cell.

EXAMPLE 2

Figure 3:
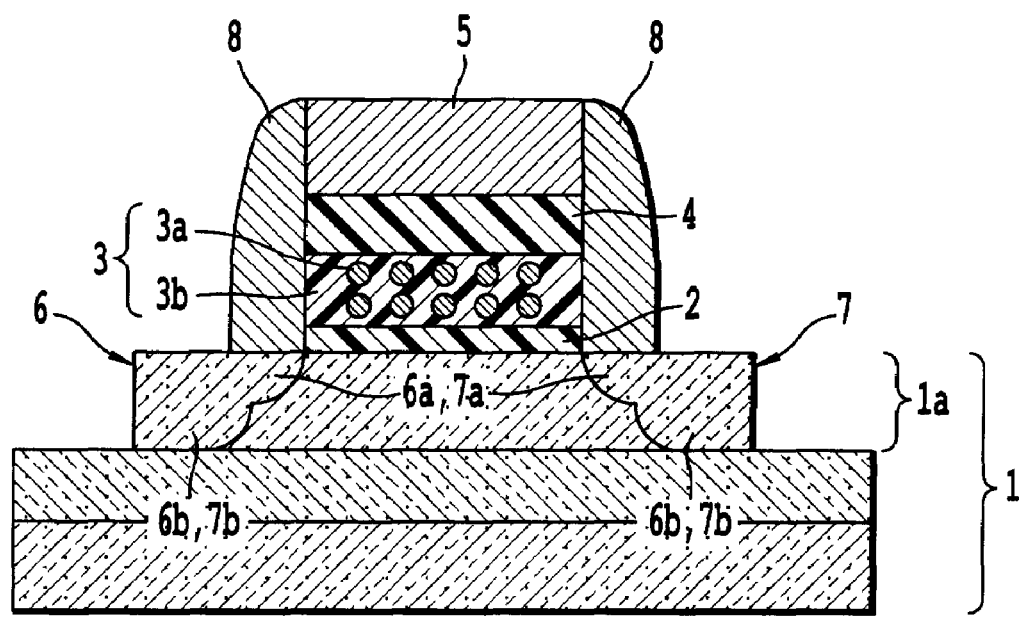
FIG. 3 is a cross-sectional schematic view showing Example 2 of the nonvolatile semiconductor memory device of the present invention.
Figure 4:
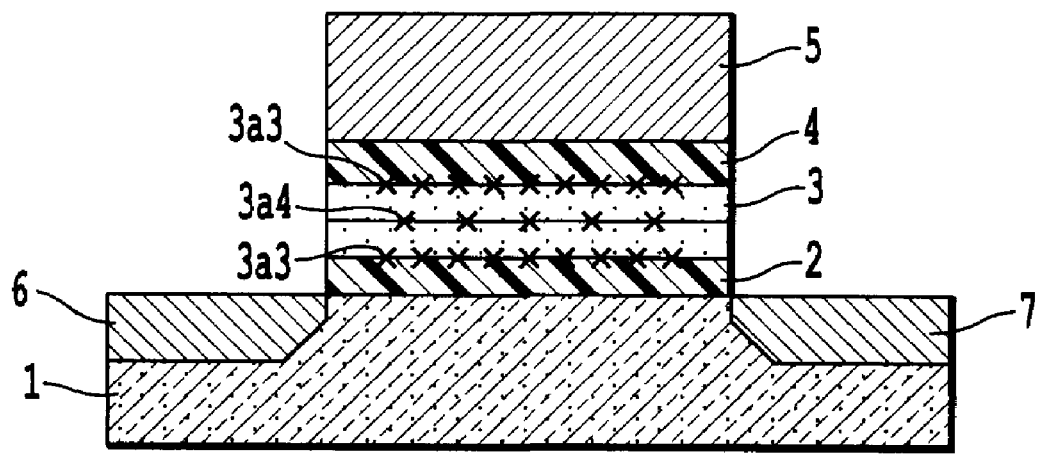
FIG. 4 is a cross-sectional schematic view showing an example of conventional MONOS memory.
Figure 5:
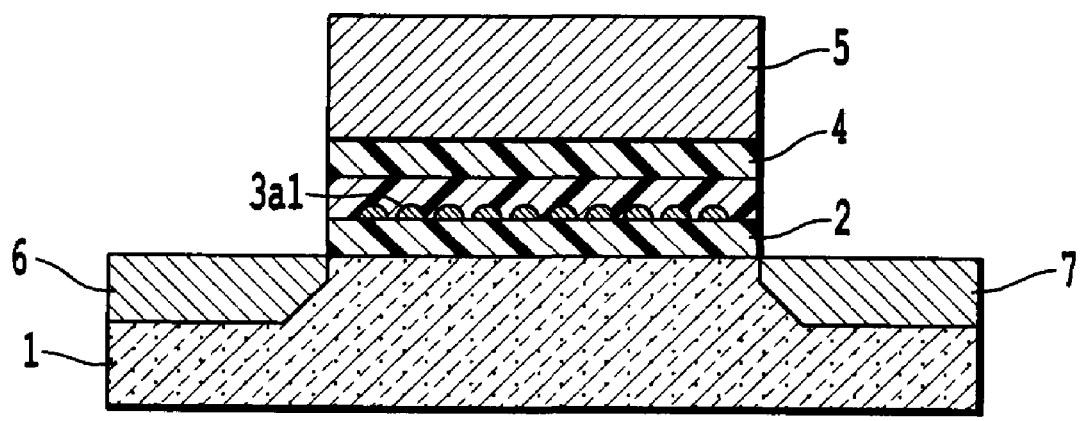
FIG. 5 is a cross-sectional schematic view showing an example of conventional semiconductor memory device containing Si nano-particles.

The nonvolatile semiconductor memory device of this example is explained, referring to FIG. 3. An SOI (Silicon On Insulator) substrate having a p-type SOI layer 1a, was employed for a p-type semiconductor substrate 1. An isolation was performed by a mesa process and boron was implanted to adjust the threshold voltage. The work function of the p-type SOI layer 1a was estimated to be 4.95 eV at this time. Then, a tunnel insulating film 2 was formed on the surface of the p-type SOI layer 1a. The tunnel insulating film 2 was formed by subjecting the semiconductor substrate to thermal oxidation at 800° C. and has a thickness of 3 nm.

Then, a charge retention layer 3 composed of an insulating matrix 3b containing nano-particles 3a was formed to have a thickness of 5 nm by a capacitively coupled magnetron sputtering method as follows. Metal Ru having a work function of 4.7 eV was selected for the material of the nano-particles, and AlN having a negative electron affinity was selected for the insulating matrix. In this case, the difference between work functions of the p-type SOI substrate 1a and the Ru nano-particles 3a was 0.25 eV. In the sputtering step, a sintered target formed by sintering a mixture of high-purity Ru and high-purity AlN powders having a mixture ratio of 10:90 vol % was employed.

After evacuating a deposition chamber of a sputtering apparatus to $5 \times 10^{-4}$ Pa, an Ar gas was introduced and the gas flow rate was adjusted so that the gas pressure of the deposition chamber became 0.5 Pa. Plasma was generated by supplying a RF (13.56 MHz) power of 200 W, and a Ru—AlN type charge retention layer was deposited to have a thickness of 3 nm. The film was evaluated by TEM and it was confirmed that Ru nano-particles having a particle size of 2 nm and a density of $8 \times 10^{+12}/cm^2$ were dispersed in an amorphous AlN insulating matrix.

After forming a $SiO_2$ film as a gate insulating film 4 on the Ru—AlN composite film, poly-silicon was deposited as a control gate electrode 5 by a low-pressure CVD method. Then, a positive photoresist was patterned to form a mask for gate etching, followed by dry etching the poly-silicon as the control gate electrode 5, the gate insulating film 4 and the charge retention layer 3.

After forming shallow junction regions 6a and 7a by implanting As ions with low energy, a $SiO_2$ film was deposited by a low-pressure CVD method. By anisotropically etching the $SiO_2$ film, a side wall 8 was formed. Then, after forming contact regions 6b and 7b in which As ions were slightly deeply implanted, a source region 6 and a drain region 7 were completed by RTA (Rapid Thermal Anneal) treatment. After a passivation film was deposited, a contact hole was formed and an Al electrode was formed so as to be in contact with the source region 6, the drain region 7 and the control gate electrode 5.

The nonvolatile semiconductor memory device of the present invention remarkably improves the charge retention characteristic as compared with conventional memory devices of the same type such as flash memories with Si floating gate or Si nano-particle memories. Further, as a result, it becomes possible to reduce the thickness of a tunnel insulating film or a gate insulating film present on a charge retention layer, whereby it is possible to improve data-writing and erasing speeds and to operate the device at low voltage. Further, in terms of miniaturization of the device, it becomes possible to reduce a memory cell dimension, which has been difficult to achieve in the above-mentioned conventional memory devices.

Further, according to the present invention, not only the charge retention characteristic of nonvolatile semiconductor memory devices is improved, but also high integration, high-speed operation and lower power consumption can be achieved. Therefore, it is expected to become possible to apply nonvolatile semiconductor memory devices to applications and technical fields that have been difficult for conventional recording media. In particular, it is expected to become possible to apply nonvolatile semiconductor memory devices to a wide range of application in mobile information devices, and to nonvolatilize memories built in personal computers by replacing DRAMs.

What is claimed is:

1. A nonvolatile semiconductor memory device comprising:
    a source region and a drain region formed on a surface of a semiconductor substrate;
    a channel-forming region formed so as to connect the source region and the drain region or so as to be sandwiched between the source region and the drain region;
    a tunnel insulating film formed in contact with the channel-forming region;
    a charge retention layer formed adjacently to the tunnel insulating film;
    a gate insulating film formed adjacently to the charge retention layer; and
    a control gate formed adjacently to the gate insulating film,
    wherein the charge retention layer includes an insulating matrix having, per nonvolatile semiconductor memory device, one conductive nano-particle which is made of at least one single-element substance or chemical compound that functions as a floating gate and has a particle size of at most 5 nm, or including a plurality of conductive nano-particles of the same type independently dispersed with a density of from $10^{+12}$ to $10^{+14}$ particles per square centimeter in the charge retention layer; the insulating matrix is amorphous and has an electron affinity of at most 1.0 eV, and the work function of the conductive nano-particles is at least 4.2 eV, and
    wherein the conductive nanoparticles and the insulating matrix comprise a medium co-sputtered from a common target including both the insulating matrix and the substance of the conductive nanoparticles.

2. The nonvolatile semiconductor memory device according to claim 1, wherein the difference between the work function of the nano-particles and the work function of the semiconductor substrate is at most 0.5 eV.

3. The nonvolatile semiconductor memory device according to claim 1, wherein the difference between the work function of the nano-particles and the work function of the control gate is at most 0.5 eV.

4. The nonvolatile semiconductor memory device according to claim 1, wherein the distance between surfaces of the nano-particles adjacent to each other is from 1 to 5 nm.

5. The nonvolatile semiconductor memory device according to claim 1, wherein at least one of the insulating matrix and the charge retention layer comprises at least one chemical compound selected from the group consisting of an oxide, a carbide, a nitride, a boride, a silicide, and a fluoride.

6. The nonvolatile semiconductor memory device according to claim 1, wherein the nano-particles including the charge retention layer are dispersed two-dimensionally or three-dimensionally in the insulating matrix.

7. A nonvolatile semiconductor memory device comprising:
    a source region and a drain region formed on a surface of a semiconductor substrate;
    a channel-forming region formed so as to connect the source region and the drain region or so as to be sandwiched between the source region and the drain region;
    a tunnel insulating film formed in contact with the channel-forming region;
    a charge retention layer formed adjacently to the tunnel insulating film;
    a gate insulating film formed adjacently to the charge retention layer; and a control gate formed adjacently to the gate insulating film,
    wherein the charge retention layer includes an insulating matrix having, per nonvolatile semiconductor memory device, one semiconductive or insulating nano-particle which is made of at least one single-element substance or chemical compound that functions as a floating gate and has a particle size of at most 5 nm, or including a plurality of semiconductive or insulating nano-particles of the same type independently dispersed with a density of from $10^{+12}$ to $10^{+14}$ particles per square centimeter in the charge retention layer, the insulating matrix is amorphous and has an electron affinity of at most 1.0 eV, and the electron affinity of the nano-particles is at least 4.2 eV, and
    wherein the semiconductive or insulating nanoparticles and the insulating matrix comprise a medium co-sputtered from a common target including both the insulating matrix and the substance of the semiconductive or insulating nanoparticles.

8. The nonvolatile semiconductor memory device according to claim 7, wherein the difference between the work function of the nano-particles and the work function of the semiconductor substrate is at most 0.5 eV.

9. The nonvolatile semiconductor memory device according to claim 7, wherein the difference between the work function of the nano-particles and the work function of the control gate is at most 0.5 eV.

10. The nonvolatile semiconductor memory device according to claim 7, wherein the distance between surfaces of the nano-particles adjacent to each other is from 1 to 5 nm.

11. The nonvolatile semiconductor memory device according to claim 7, wherein at least one of the insulating matrix and the charge retention layer comprises at least one chemical compound selected from the group consisting of an oxide, a carbide, a nitride, a boride, a silicide, and a fluoride.

12. The nonvolatile semiconductor memory device according to claim 7, wherein the nano-particles including the charge retention layer are dispersed two-dimensionally or three-dimensionally in the insulating matrix.

* * * * *